(12) United States Patent
Aritome

(10) Patent No.: US 7,560,335 B2
(45) Date of Patent: Jul. 14, 2009

(54) MEMORY DEVICE TRANSISTORS

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 444 days.

(21) Appl. No.: 11/215,989

(22) Filed: Aug. 30, 2005

(65) Prior Publication Data

US 2007/0048881 A1    Mar. 1, 2007

(51) Int. Cl.
*H01L 21/20* (2006.01)
(52) U.S. Cl. .................... 438/257; 438/258; 438/259; 438/296; 438/593; 257/E21.209; 257/E21.422; 257/E21.546; 257/E21.679; 257/E27.103; 257/E29.129; 257/E29.316
(58) Field of Classification Search ......... 438/257–259, 438/207, 211, 199, 296, 593; 257/239, E29.129, 257/E21.687, E21.209, 422, 546, 679, 682, 257/E27.103, E29.316
See application file for complete search history.

(56) References Cited

U.S. PATENT DOCUMENTS

| | | | |
|---|---|---|---|
| 5,541,130 A * | 7/1996 | Ogura et al. ............... 438/257 |
| 5,780,341 A * | 7/1998 | Ogura ...................... 438/259 |
| 5,828,130 A * | 10/1998 | Miller et al. ............... 257/754 |
| 5,889,304 A | 3/1999 | Watanabe et al. |
| 5,946,230 A | 8/1999 | Shimizu et al. |
| 6,049,082 A | 4/2000 | Methfessel |
| 6,074,956 A * | 6/2000 | Yang et al. ................ 438/721 |
| 6,240,012 B1 | 5/2001 | Nakamura et al. |
| 6,265,739 B1 | 7/2001 | Yaegashi et al. |
| 6,323,516 B1 * | 11/2001 | Wang et al. ............... 257/317 |
| 6,337,805 B1 | 1/2002 | Forbes et al. |
| 6,353,242 B1 | 3/2002 | Watanabe et al. |
| 6,380,010 B2 * | 4/2002 | Brigham et al. ............ 438/161 |
| 6,413,809 B2 | 7/2002 | Nakamura et al. |
| 6,461,915 B1 | 10/2002 | Rudeck |
| 6,495,896 B1 | 12/2002 | Yaegashi et al. |
| 6,611,010 B2 | 8/2003 | Goda et al. |
| 6,665,206 B2 * | 12/2003 | Salling .................... 365/145 |
| 6,677,224 B2 * | 1/2004 | Tseng .................... 438/593 |
| 6,756,271 B1 * | 6/2004 | Satoh et al. ............... 438/258 |
| 6,759,707 B2 | 7/2004 | Prall et al. |
| 6,828,627 B2 | 12/2004 | Goda et al. |
| 6,849,501 B2 | 2/2005 | Rudeck |
| 6,891,246 B2 | 5/2005 | Aritome et al. |
| 6,951,790 B1 | 10/2005 | Violette |
| 2001/0001075 A1 * | 5/2001 | Ngo et al. ................. 438/257 |

* cited by examiner

*Primary Examiner*—Michael S Lebentritt
(74) *Attorney, Agent, or Firm*—Schwegman, Lundberg & Woessner, P.A.

(57) ABSTRACT

Method and device embodiments are described for fabricating MOSFET transistors in a semiconductor also containing non-volatile floating gate transistors. MOSFET transistor gate dielectric smiling, or bird's beaks, are adjustable by re-oxidation processing. An additional re-oxidation process is performed by opening a poly-silicon layer prior to forming an inter-poly oxide dielectric provided for the floating gate transistors.

26 Claims, 12 Drawing Sheets

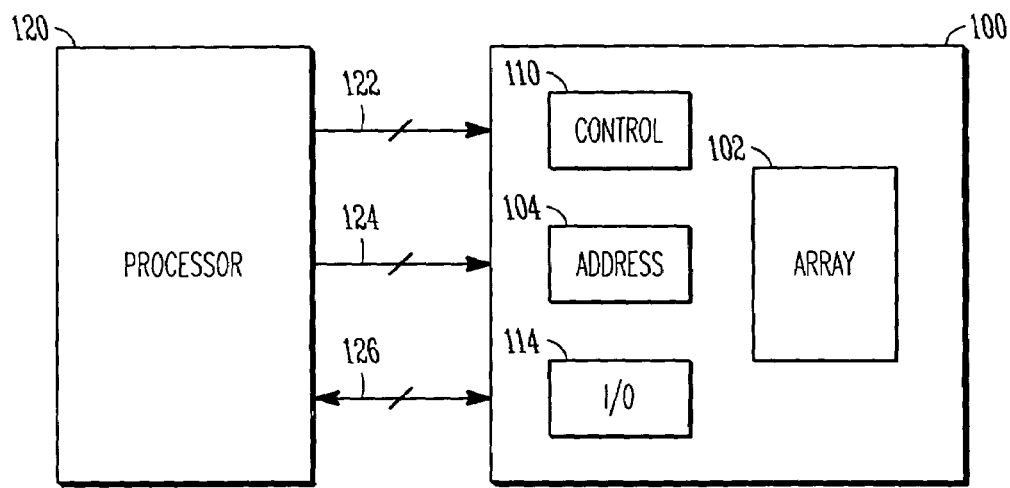
FIG. 1
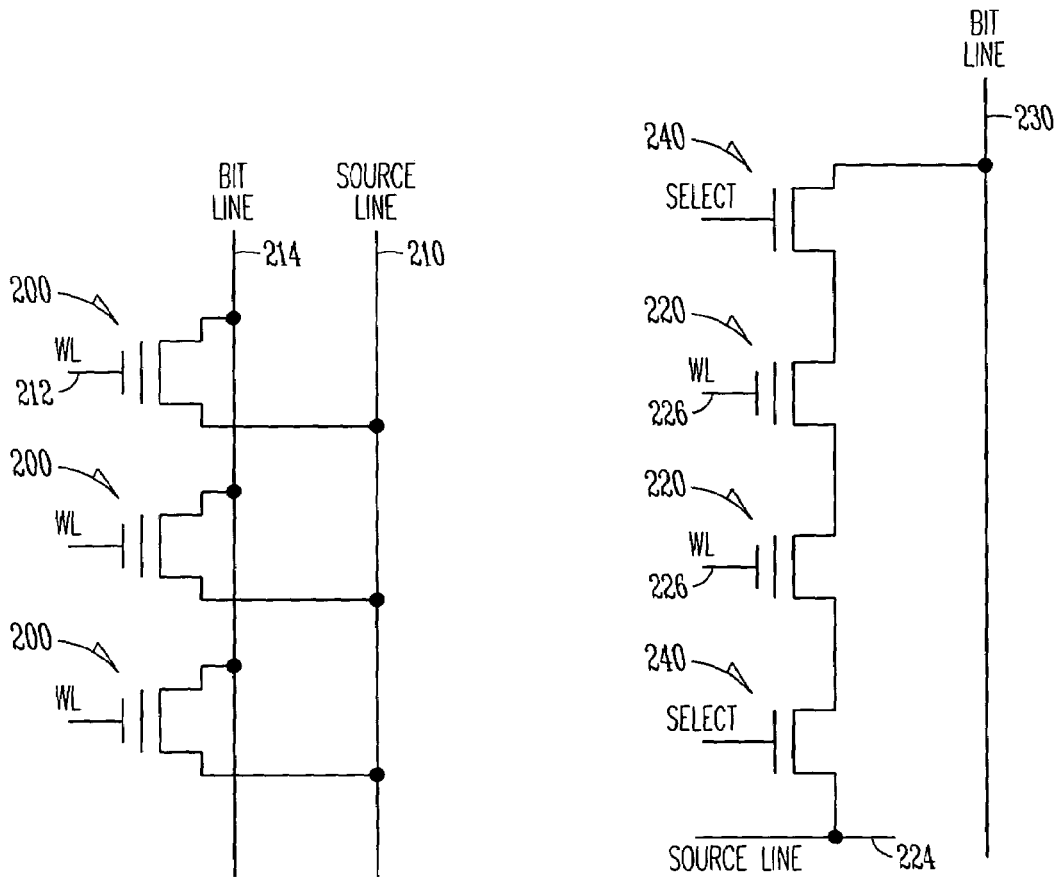
FIG. 2
-PRIOR ART-
FIG. 3
-PRIOR ART-

—PRIOR ART—

MEMORY DEVICE TRANSISTORS

FIELD OF THE INVENTION

The present invention relates to semiconductor memory devices and, more particularly, to transistor fabrication in a memory device.

BACKGROUND

Flash memory is non-volatile, which means that it stores information on a semiconductor in a way that does not need power to maintain the information in the chip. Flash memory is based on the Floating-Gate Avalanche-Injection Metal Oxide Semiconductor (FAMOS transistor) which is essentially a Complimentary Metal Oxide Semiconductor (CMOS) Field Effect Transistor (FET) with an additional conductor suspended between the gate and source/drain terminals. Current flash memory devices are made in two forms: NOR flash and NAND flash. The names refer to the type of logic used in the storage cell array. Further, flash memory stores information in an array of transistors, called "cells," each of which traditionally stores one or more bits of information.

A flash cell is similar to a standard MOSFET transistor, except that it has two gates instead of just one. One gate is the control gate (CG) like in other MOS transistors, but the second is a floating gate (FG) that is insulated all around by an oxide layer. The FG is between the CG and the substrate. Because the FG is isolated by its insulating oxide layer, any electrons placed on it get trapped there and thus store the information.

When electrons are trapped on the FG, they modify (partially cancel out) an electric field coming from the CG, which modifies the threshold voltage (Vt) of the cell. Thus, when the cell is "read" by placing a specific voltage on the CG, electrical current will either flow or not flow between the cells source and drain connections, depending on the Vt of the cell. This presence or absence of current is sensed and translated into 1's and 0's, reproducing the stored data.

Fabricating floating gate transistors and standard MOSFET transistor on a common integrated circuit require slightly different process steps. This is because standard MOSFET transistors do not have a floating gate. To reduce costly process variations the MOSFET transistors are fabricated with a floating gate structure, but modified to make electrical contact to the floating gate.

For reasons stated below which will become apparent to those skilled in the art upon reading and understanding the present specification, there is a need for methods and devices to fabricate transistors in a memory device.

BRIEF DESCRIPTION OF THE DRAWINGS

FIG. 1 is a simplified block diagram of an integrated circuit dynamic memory device in accordance with an embodiment of the invention;

FIG. 2 is a partial schematic diagram of a prior art NOR flash array;

FIG. 3 is a partial schematic diagram of a prior art NAND flash array;

DESCRIPTION

Figure 4A:
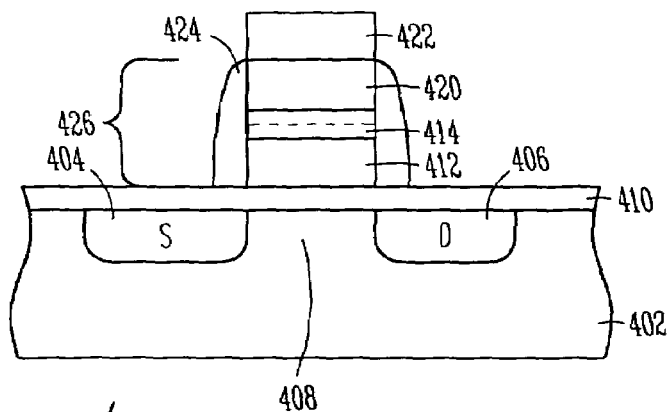
FIGS. 4A-4D are cross-section views of a prior art in-process floating gate transistor.

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface onto which a layer is deposited according to the present invention, for example to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures. The term conductor is understood to include semiconductors, and the term insulator is defined to include any material that is less electrically conductive than the materials referred to as conductors.

Relative terms such as above, below, lateral and adjacent are not limited to an specific coordinate system. These terms are used to describe relative positions between components and are not intended to be limitations. As such, additional components can be positioned between components that are above, below, lateral and adjacent to each other. Further, the figures are provided to help facilitate an understanding of the detailed description and are not intended to be accurate in scale and have been simplified.

Embodiments of the present invention can include a semiconductor memory device having an array of memory cells. The memory cells are non-volatile charge trapping cells for example floating gate transistors. In addition, the memory cells can store one or more data bits per cell.

FIG. 1 is a simplified block diagram of an integrated circuit memory device 100 in accordance with an embodiment of the invention. The memory device 100 includes an array of non-volatile floating gate memory cells 102, a address circuitry 104, control circuitry 110, and Input/Output (I/O) circuitry 114. The memory cells are also referred to as Flash memory cells because blocks of memory cells are erased concurrently, in a flash operation.

The memory device 100 can be coupled to a processor 120 or other memory controller for accessing the memory array 102. The memory device 100 coupled to a processor 120 forms part of an electronic system. Some examples of electronic systems include personal computers, peripheral devices, wireless devices, digital cameras, personal digital assistants (PDA's) and audio recorders.

The memory device 100 receives control signals across control lines 122 from the processor 120 to control access to the memory array 102 via control circuitry 110. Access to the memory array 102 is directed to one or more target memory cells in response to address signals received across address lines 124. Once the array is accessed in response to the control signals and the address signals, data is written to or read from the memory cells across data, DQ, lines 126.

It will be appreciated by those skilled in the art that additional circuitry and control signals can be provided, and that the memory device of FIG. 1 has been simplified to help focus on the invention. It will be understood that the above description of a memory device is intended to provide a general understanding of the memory and is not a complete description of all the elements and features of a typical memory device.

Flash memory is nonvolatile memory that can be erased and reprogrammed in units of memory called blocks. A write operation in any flash device can only be performed on an empty/erased unit, so in most cases an erase operation must precede the write operation.

As shown in FIG. 2 a simplified portion of a NOR flash memory array is described. The memory array includes floating gate memory cells 200 coupled to source line 210, word lines 212 and bit line 214. The cells are arranged in a NOR configuration.

A NOR flash cell is programmed (set to a specified data value) by conducting electrons from the source to the drain, with a large voltage placed on the CG a strong electric field to drives electrons onto the FG, a process called hot-electron injection. To erase (reset to all 1's, in preparation for reprogramming) a NOR flash cell, a large voltage differential is placed between the CG and source, which pulls the electrons off through Fowler-Nordheim tunneling, a quantum mechanical tunneling process. Most NOR flash memory components are divided into erase segments, usually called either blocks or sectors. All of the memory cells in a block are erased at the same time. NOR programming, however, can generally be performed one byte or word at a time.

In a read operation, a word line is activated to access a memory cell. Based upon a charge status of the floating gate, the memory cell may be activated. That is, if the floating gate is not charged the cell has a lower threshold voltage and can be activated by a control gate voltage on the word line. When activated the source line is coupled through the cell to the bit line. As such, the bit line voltage or current is used to read the memory cell. To program or erase a cell, the source line, bit line and word line voltages are controlled to either add or remove charge to the floating gate cell, as explained above.

FIG. 3 illustrates a simplified portion of a NAND flash memory array. NAND Flash uses tunnel injection for writing and tunnel release for erasing. The NAND memory also includes floating gate memory cells 220 coupled to source line 224, word lines 226 and a bit line 230. Unlike the NOR memory arrangement, the NAND memory cells are coupled in a NAND configuration. That is the cells are coupled in series between the bit line and source line. One or more bit line select transistors 240 are used to selectively isolate the cells from the bit and source lines.

In a read operation, a word line of a target (selected) memory cell is maintained at a low voltage level. All unselected cell word lines are coupled to a voltage sufficiently high to activate the unselected cells regardless of their floating gate charge. If the selected cell has an uncharged floating gate it is activated. The bit line and source line are then coupled through the series of memory cells. If the selected cell has a charged floating gate it will not activate. The bit line and source lines, therefore, are not coupled through the series of memory cells.

Figure 4B:
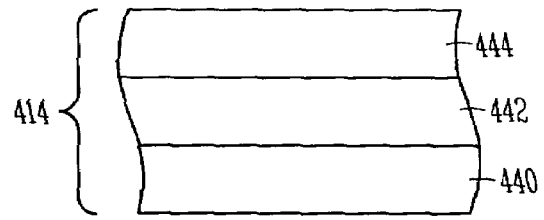
Figure 4C:
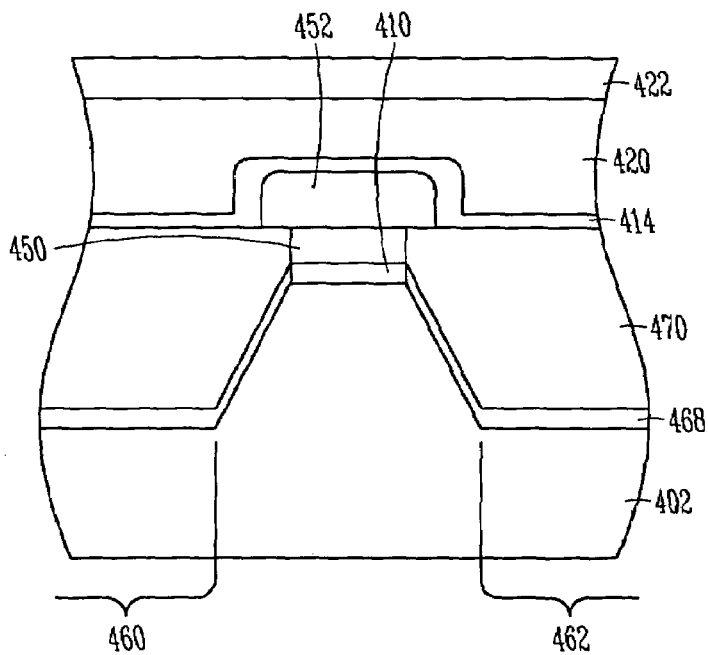

The transistor cell for NAND or NOR memory cell are substantially the same. That is, each transistor has a control gate, a floating gate, a source region and a drain region. FIGS. 4A, 4B and 4C illustrates a simplified cross-section views of a typical floating gate memory cell which can be used in either NAND or NOR devices. Further, the present invention can be implemented in other integrated circuits having embedded floating gate memory transistors therein.

Referring to FIG. 4A, the floating gate transistor 400 is fabricated in a semiconductor active area 402. A source region 404 and a drain region 406 are formed, such as by implanting, in the active area. As known to those in the art, a channel region 408 between the source and drain regions is controlled during operation.

A gate dielectric 410, such as an oxide, is located between the channel region and a floating gate 412. The gate dielectric can also be referred to as a tunnel dielectric. The floating gate is typically fabricated with a poly-silicon material. Different fabrication processes can be used to make the floating gate. In one embodiment, the floating gate is fabricated from a single layer of poly-silicon. In another embodiment, the floating gate can be fabricated as multiple layers of poly-silicon, as illustrated below. The present invention, however, is not limited to fabrication using multiple layers of poly-silicon.

Above the floating gate is an inter-gate dielectric 414, also referred to an inter-poly dielectric. This dielectric can be multiple layers. For example a dielectric of oxide-nitride-oxide (ONO) layers, as shown in FIG. 4B, include a first oxide layer 440, a nitride layer 442 and a second oxide layer 444.

A control gate 420 is located above the inter-gate dielectric. The control gate can also be fabricated using a poly-silicon material. A metal layer 422 can be coupled to the control gate. This layer has a higher conductivity than poly-silicon and can include a material such as a Tungsten Silicon film (WSi).

Spacers 424 are provided on the sidewalls of the gate stack 426. In this embodiment the gate stack includes the floating gate 412, inter-gate dielectric 414 and the control gate 420.

FIG. 4C is a perpendicular cross-section view of the transistor of FIG. 4A through the channel region 408. The active area 402 appears as a pillar in this view with shallow trench isolation regions (STI) 460 and 462 on opposite sides of the active area. The STI is lined with an oxide layer 468 and filled with a dielectric material 470 such as chemical vapor deposited (CVD) silicon dioxide ($SiO_2$). The oxide fills the STI regions to provide electrical and physical separation between neighboring active regions 402.

The floating gate is fabricated as two layers of poly-silicon 450 and 452. Poly-silicon 452 laterally extends beyond poly-silicon 450. During fabrication the edges of the gate dielectric 410 near the STI regions is modified by continued oxidation, or re-oxidation. That is, the STI oxidation process, forming the bottom layer 440 of the ONO inter-gate dielectric and the side wall spacer 424 oxidation process contribute to the gate dielectric. The floating gate is formed in two poly-silicon deposition steps to allow for self-aligned etching of the STI regions.

Figure 4D:
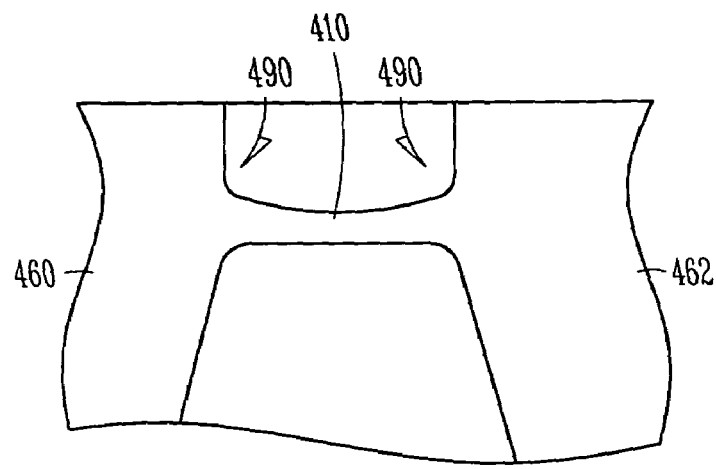

FIG. 4D illustrates a 'smile' formed in the gate dielectric. The gate dielectric layer 410 thickness increases at end locations 490 near the STI regions 460 and 462. It is noted that although the gate and STI dielectric regions may be formed separately the oxide material 410, 468 and 470 can be illustrated as a common dielectric material. As explained below, the size of the smile regions, also referred to as "bird's beaks", has a direct relationship to the re-oxidation process of the gate dielectric.

Figure 5A:
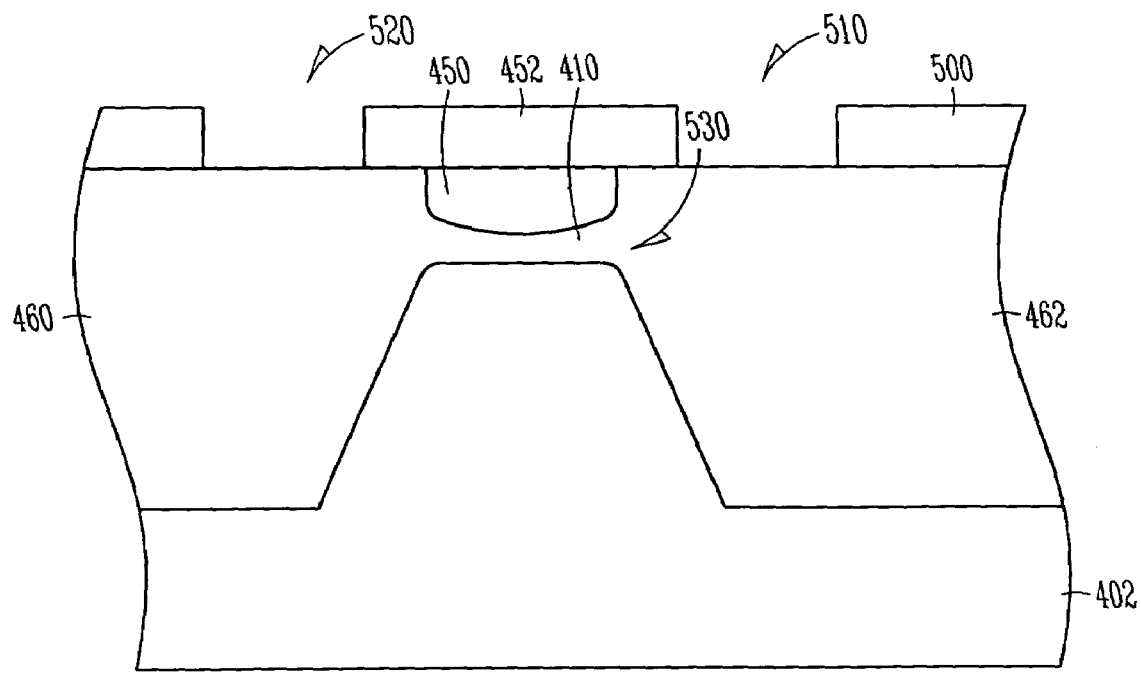
FIGS. 5A-5D are additional cross-section views of a prior art in-process floating gate transistor.
Figure 5B:
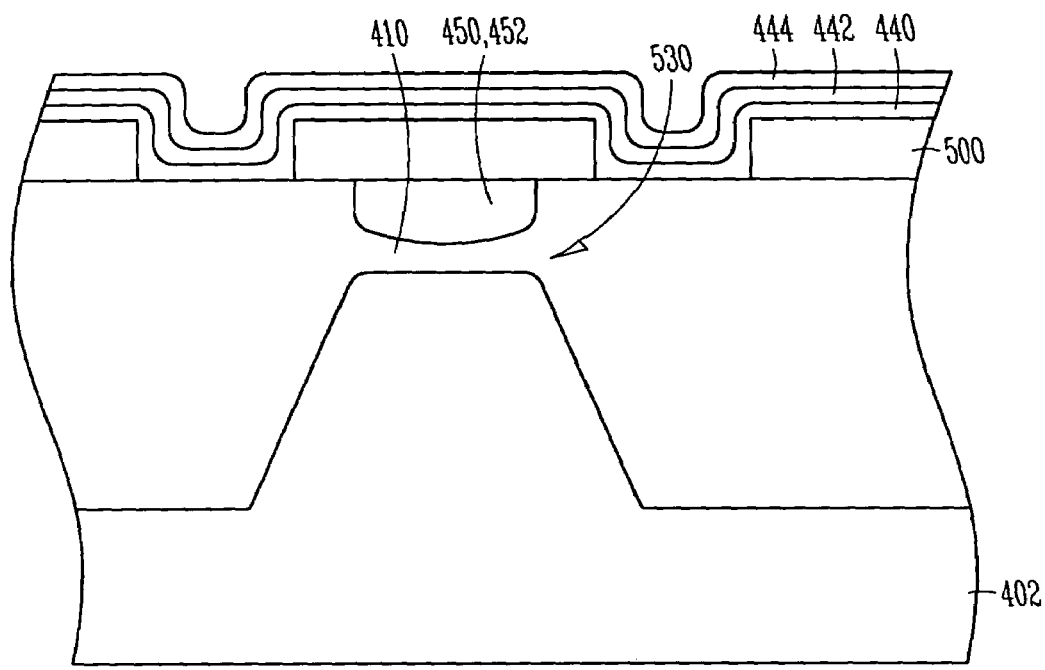

FIGS. 5A and 5B illustrate prior art partial fabrication steps of the floating gate transistor of FIG. 4A. Referring to FIG.

5A, a layer of poly-silicon has been deposited and patterned to form gate section 450 on gate dielectric 410. While etching the poly-silicon to define the floating gate 450 the self aligned trenches for the STI regions 460 and 462 were also formed. An oxide has been formed in the STI regions. The oxidation of the STI regions forms a bird's beak 530 in the gate dielectric as a result of re-oxidization.

After planarizing the STI oxide and poly-silicon 450 a poly-silicon layer 500 has been deposited. This layer has been patterned and etched to form region 452 of the floating gate. That is, openings 510 and 520, or slits, running parallel to the STI trenches have been etched through the poly-silicon layer 500. Poly-silicon 450 and 452 together form the floating gate.

In FIG. 5B the formation of ONO layers 440, 442 and 444 is illustrated. While forming oxide layer 440 the gate dielectric 410 is further re-oxidized such that the bird's beak at 530 is increased in size.

Figure 5C:
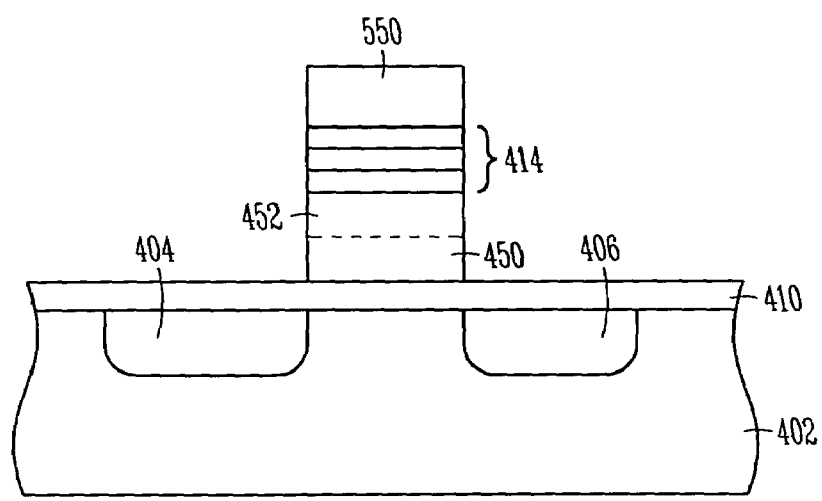
Figure 5D:
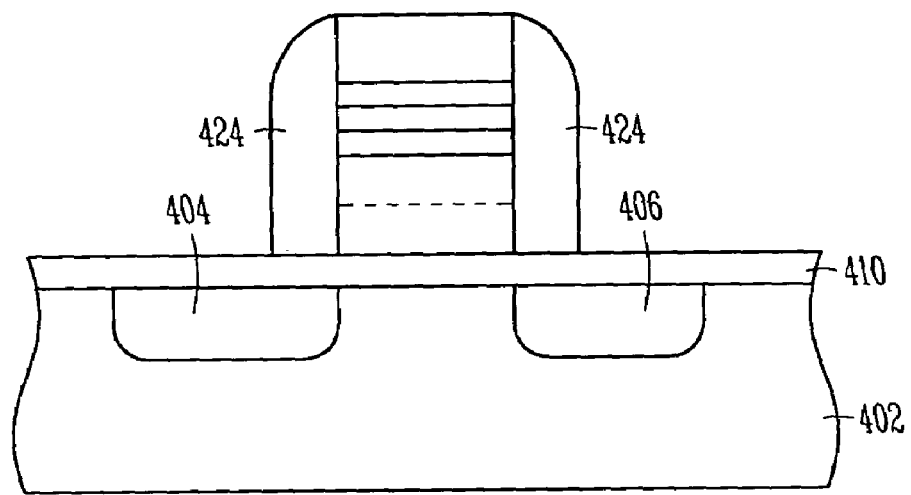

FIGS. 5C and 5D illustrate partial fabrication steps of the in-process floating gate transistor following FIG. 5B in a cross-section along active area 402. Referring to FIG. 5C, after the ONO dielectric is formed a poly-silicon layer is formed, patterned and then etched to define poly-silicon 550 of the control gate. The etch operation is performed to define the gate stack. That is, the inter gate dielectric 414 and floating gate 450 and 452 are also etched. Spacers 424 are then formed on the gate stack side as illustrated in FIG. 5D. The spacers are oxide and also re-oxidize the gate dielectric material.

Figure 6:
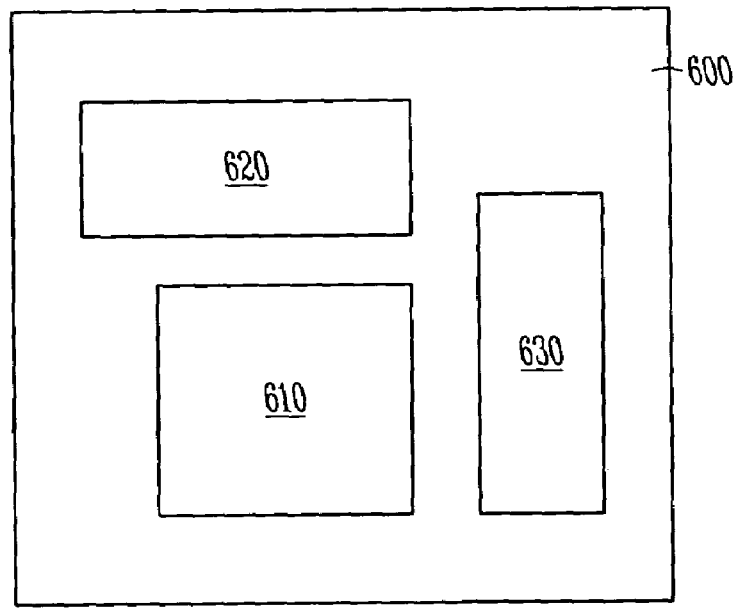
FIG. 6 is a block diagram of an integrated circuit device of an embodiment of the present invention.

A flash memory device includes both floating gate transistors and MOSFET transistors. As illustrated in the simplified block diagram in FIG. 6, the semiconductor device 600 includes an array region 610 and peripheral regions 620 and 630. The array region contains floating gate transistors, while the peripheral regions contain CMOS transistors. In a MOSFET transistor the gate dielectric smiling, or bird's beaks, help address transistor gate to substrate breakdown problems. That is, controlling the amount of smile in the gate dielectric of a transistor can be beneficial.

Because the array has floating gate transistors, in prior art memory devices the periphery MOSFET transistors follow a similar processing technique. The MOSFET transistors, however, uses the floating gate poly-silicon as a gate. Prior art techniques for forming the peripheral transistors either remove some of the inter-gate dielectric layer(s) to electrically short the control and floating gate poly-silicon layers, or provide an electrical contact to the floating gate poly-silicon.

Figure 7A:
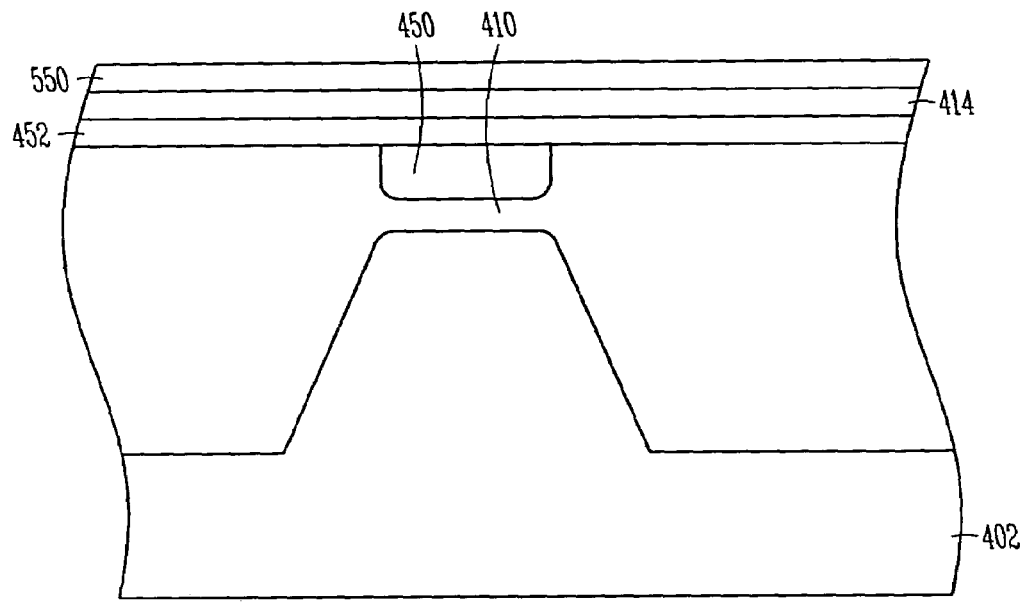
FIGS. 7A-7C are cross-section views of a prior art in-process MOSFET transistor in a non-volatile memory.
Figure 7B:
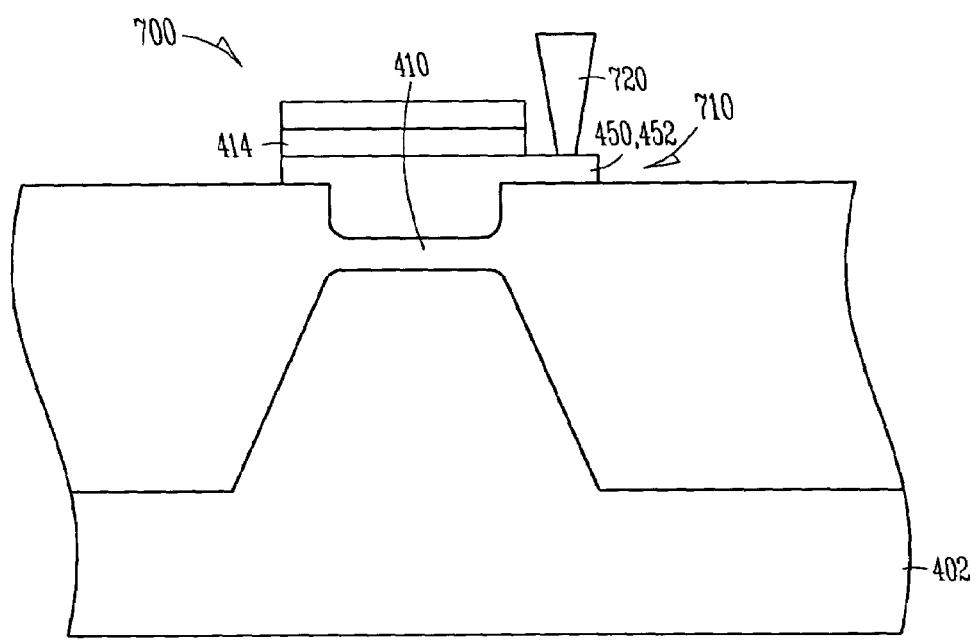
Figure 7C:
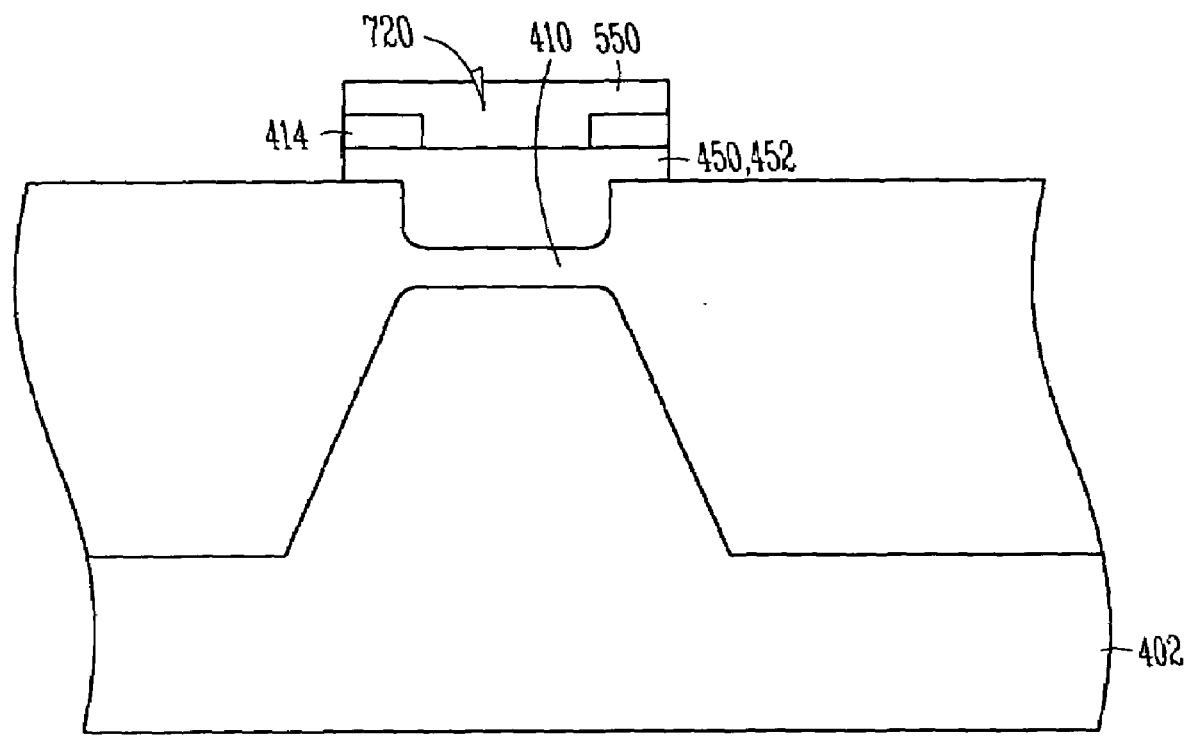

FIGS. 7A, 7B and 7C illustrate prior art partial fabrication steps of an in-process peripheral MOSFET transistor. In the cross-section of FIG. 7A, the transistor follows some of the process steps of the floating gate transistors. As such, common numbers are used. Poly-silicon 450, gate dielectric 410, trenches 460 and 462 and active area 402 are formed as described above. Poly-silicon layer 452, inter-gate dielectric 414, and poly-silicon layer 550 are also formed. Unlike the above described floating gate transistor processes, poly-silicon layer 452 is not etched prior to forming the inter-gate dielectric layers. These three layers are etched in multiple steps to provide the gate structure 700 of FIG. 7B.

Gate 700 includes a tab 710 extending from poly-silicon 452. An electrical contact 720 connects with poly-silicon 550. Alternatively, part of the inter-gate dielectric above poly-silicon 450 could be removed in the periphery prior to forming poly-silicon 550, as shown in FIG. 7C. In both of the prior art techniques, the lower poly-silicon 450 and 452 is electrically coupled to for use as a CMOS transistor gate. It is noted that some bird's beak is formed in the gate dielectric as a result of the STI oxide. The prior art techniques, however, do not etch the poly-silicon layer 452 prior to forming the inter-gate dielectric layer.

Figure 8A:
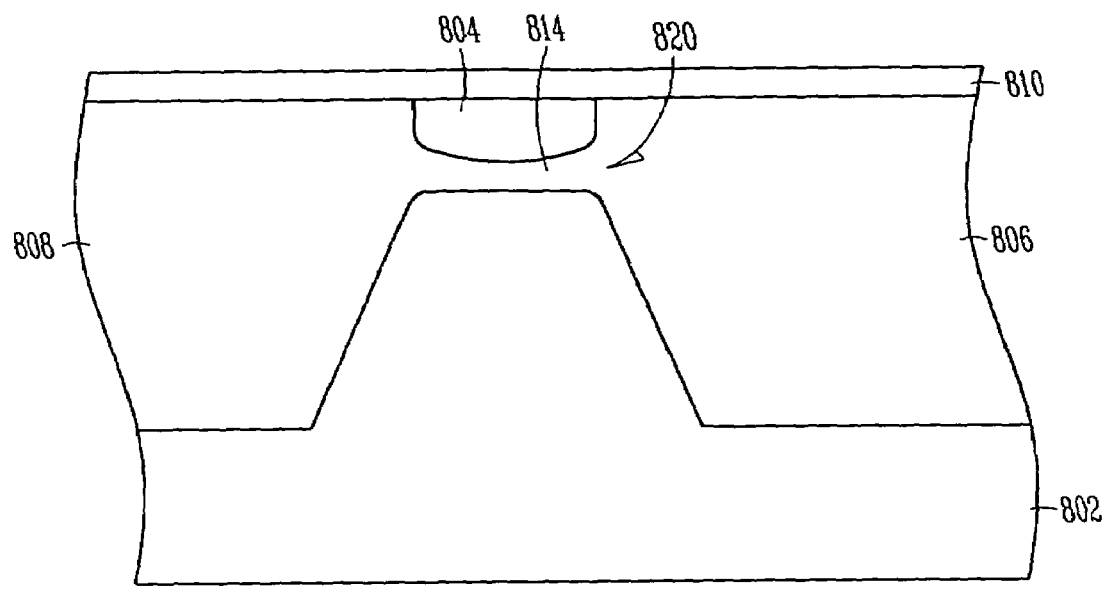
FIGS. 8A-8G are cross-section views of in-process MOSFET transistors of embodiments of the present invention.

Example embodiments of methods and structures of the present invention are described with reference to FIGS. 8A to 8G. FIG. 8A is a cross section of an in-process peripheral MOSFET transistor during fabrication. An active area 802 of the semiconductor is surrounded by isolation regions 806 and 808. As explained above, an oxide containing gate dielectric 814 is located above the active area to separate poly-silicon gate 804. Similar to the floating gate transistor processing described above, the poly-silicon gate 804 has been patterned and etched to form self-aligned the trench isolation regions which have been filled with an oxide containing material.

Figure 8B:
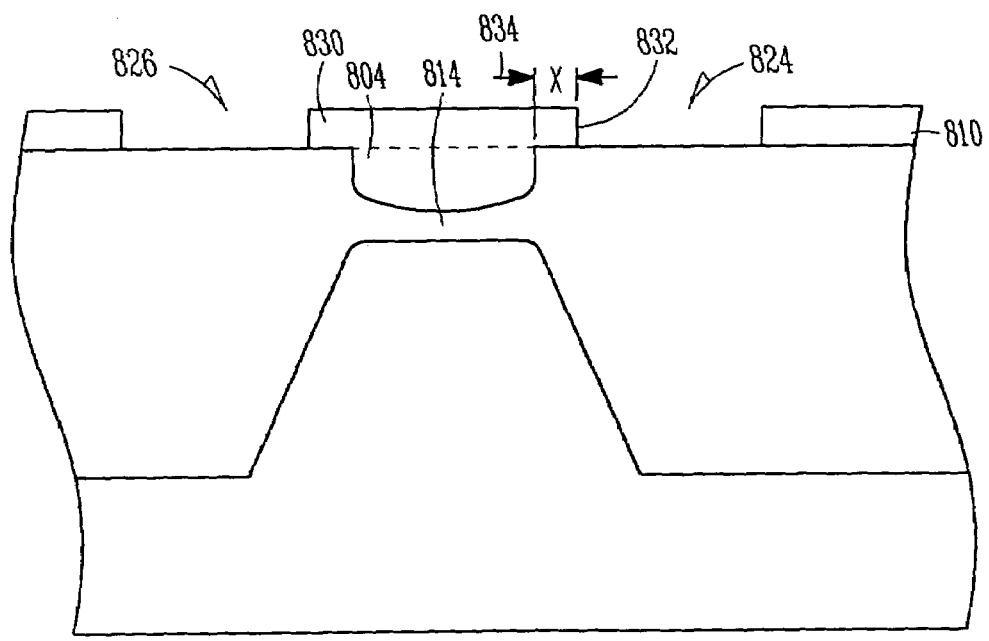

Poly-silicon 810 is formed above poly-silicon gate 804 and the STI filled regions in the same step as poly-silicon layer 500 of FIG. 5A. Poly-silicon layer 810 is patterned and etched to form gate 830 with adjacent openings 824 and 826. As shown in FIG. 8B, gate 830 has a lateral edge 832 that is spaced 834 by a distance X from the edge of gate 804. The distance of spacing 834 can be selected to adjust an amount of bird's beak under gate 804. Because the active area was etched along with the gate dielectric, lateral edge 832 is also spaced by a distance X from an edge of the active area at the gate oxide. The distance can be zero or greater.

Also shown in FIG. 8B, the shallow trench isolation can be formed by masking and etching the gate dielectric 814 and active area prior to forming poly-silicon gate 804. Here, the isolation regions are formed prior to forming the poly-silicon layer 810. The gate is therefore formed from one poly-silicon layer not multiple layers. The dotted line is used to illustrate different embodiments for forming the poly-silicon gate. The gate poly-silicon is then etched as described above with openings 824 and 826. The opening(s) have a lateral edge that is spaced by a distance X from the lateral edge of gate dielectric 804.

Figure 8C:
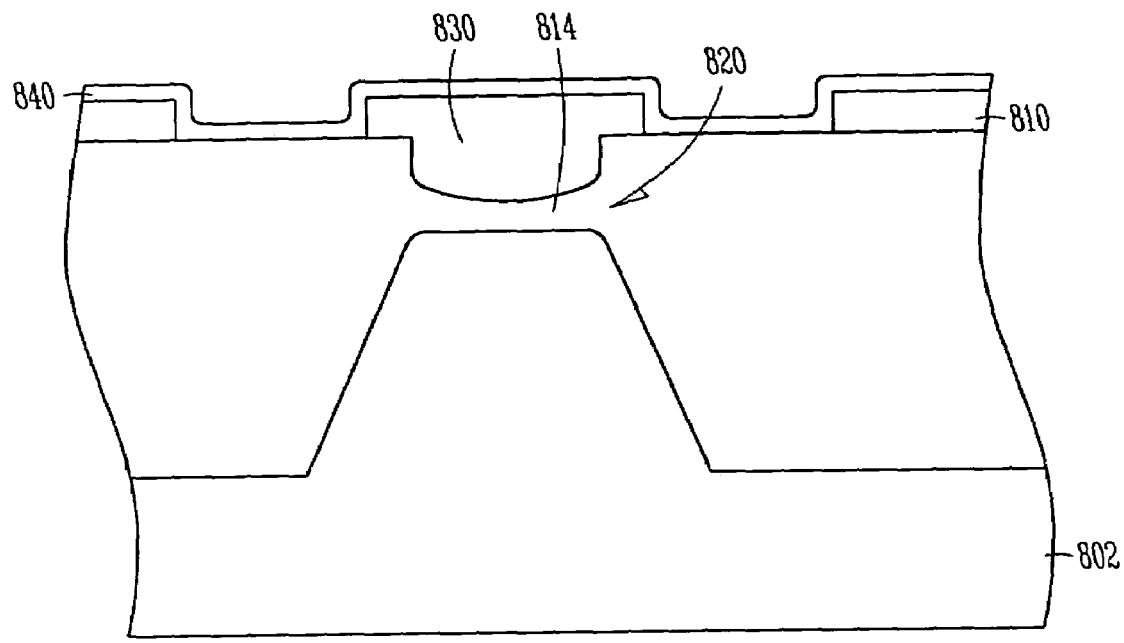

In FIG. 8C a dielectric layer 840 is formed. The dielectric layer(s) is formed at the same time as inter-gate dielectric layer 414 of FIG. 4B. That is, the dielectric includes at least a lower oxide layer 440. By providing openings 824 and 826 through poly-silicon layer 810 the lower oxide layer 440 contributes to further re-oxidizing of gate dielectric 814 at 820. As explained above, prior art methods of forming peripheral transistors in a non-volatile memory did not perform an etch operation on poly-silicon layer 810 prior to forming the inter-gate dielectric.

Figure 8D:
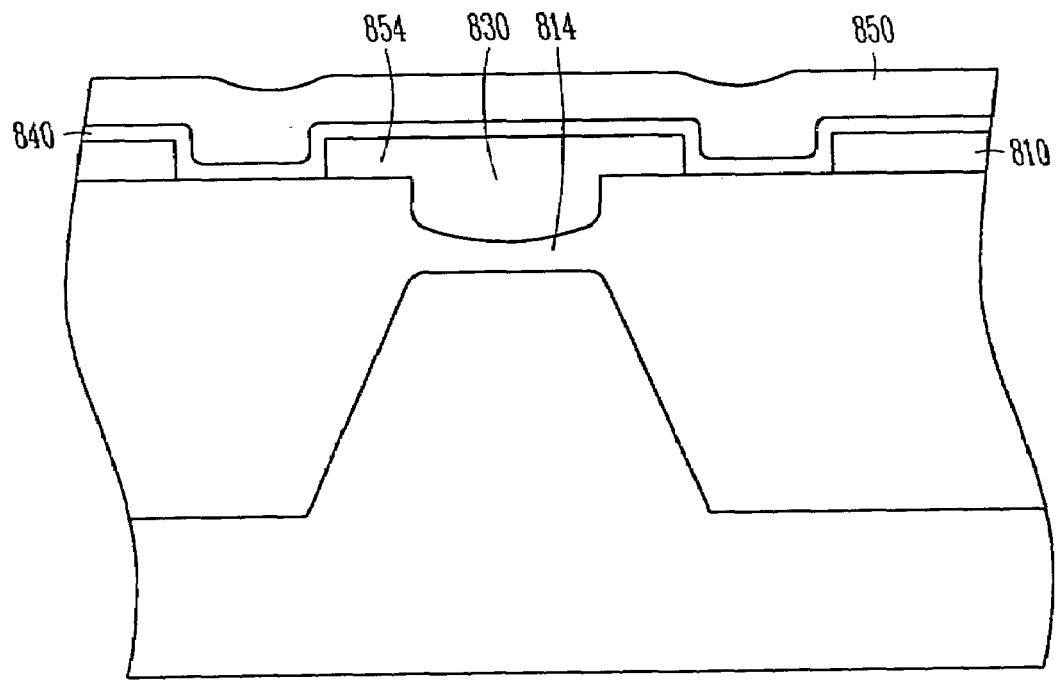
Figure 8E:
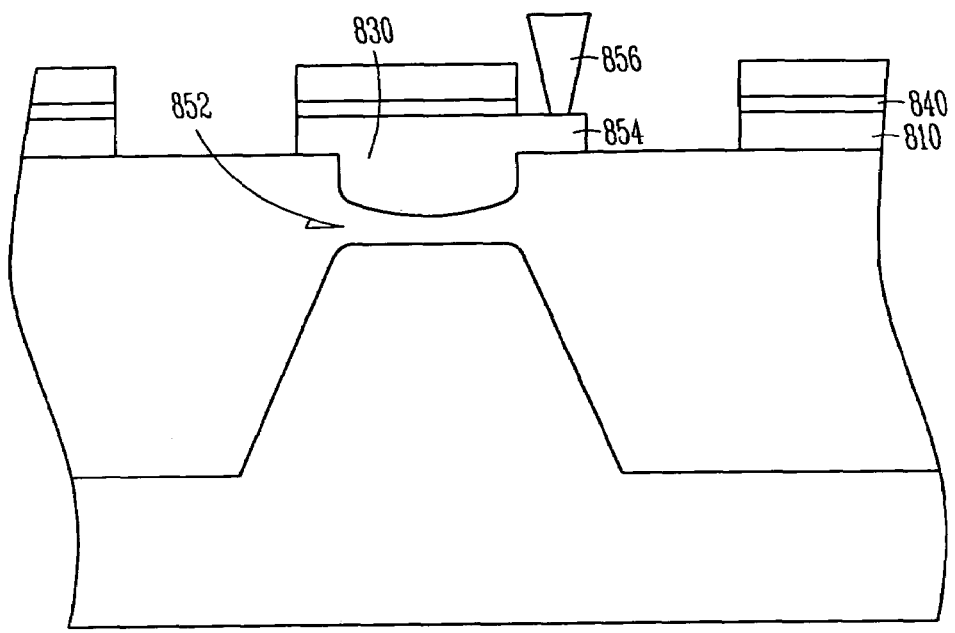

In one embodiment illustrated in FIGS. 8D and 8E, after the dielectric layer(s) 840 is formed a poly-silicon layer 850 is formed. This layer is formed at the same time with control gate layer 550 of FIG. 5C. As shown in FIG. 8E layer 850 and dielectric 840 are patterned and etched. Contact area 854 is formed to provide a region for electrical contact 856 to couple to gate 804. Bird's beak 852 is formed and controlled by providing the openings in layer 810 prior to forming dielectric 840.

Figure 8F:
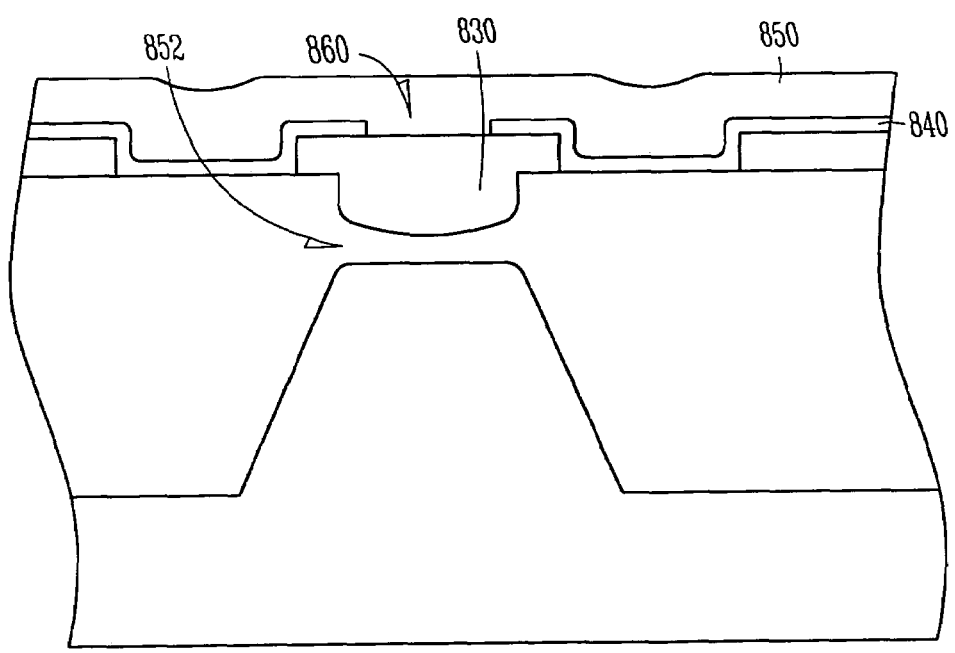
Figure 8G:
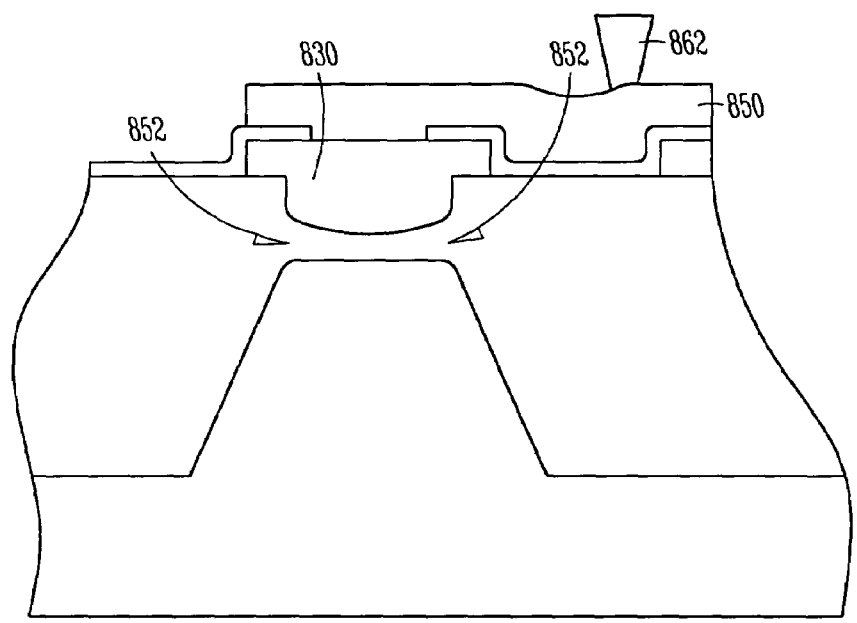

An alternate embodiment is illustrated in FIGS. 8F and 8G, after the dielectric layer(s) 840 is formed an opening 860 in the dielectric layer above gate 830 is etched. The opening exposes part of gate 830 so that poly-silicon layer 850 can contact gate 830. This layer is formed at the same time with control gate layer 550 of FIG. 5C. As shown in FIG. 8G layer 850 is patterned and etched. Electrical contact 862 can couple to gate 830 through patterned layer 850. Bird's beaks 852 are formed and controlled by providing the openings in layer 810 prior to forming dielectric 840.

Figure 9:
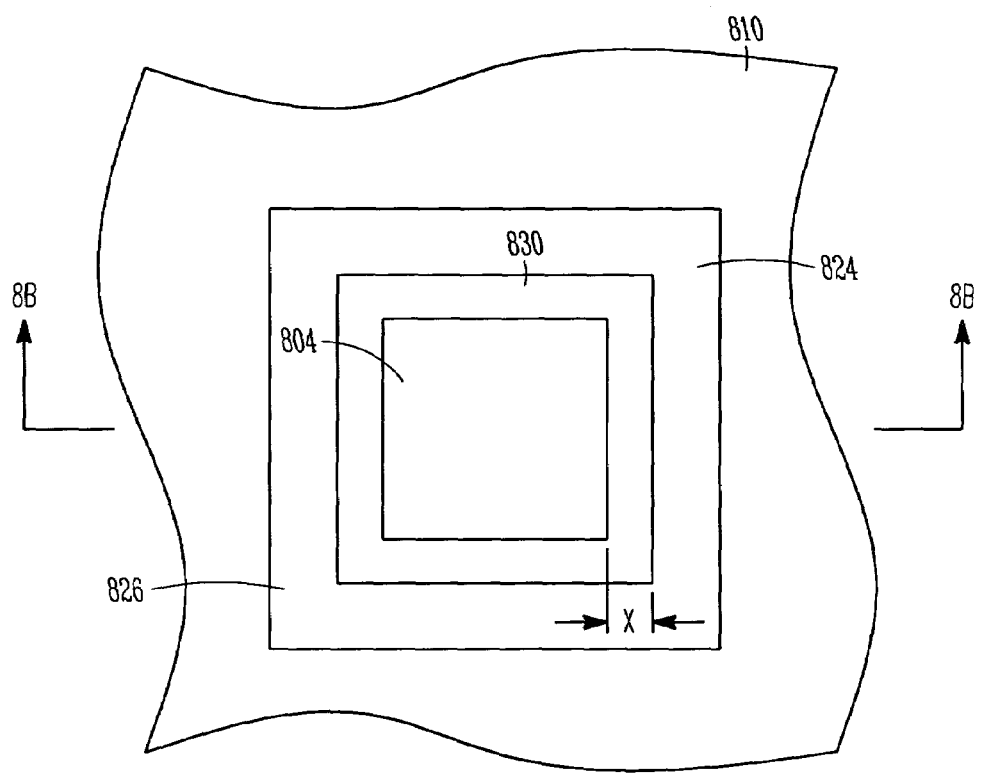
FIG. 9 is a plan view of the in-process MOSFET transistor of FIG. 8B.
Figure 10:
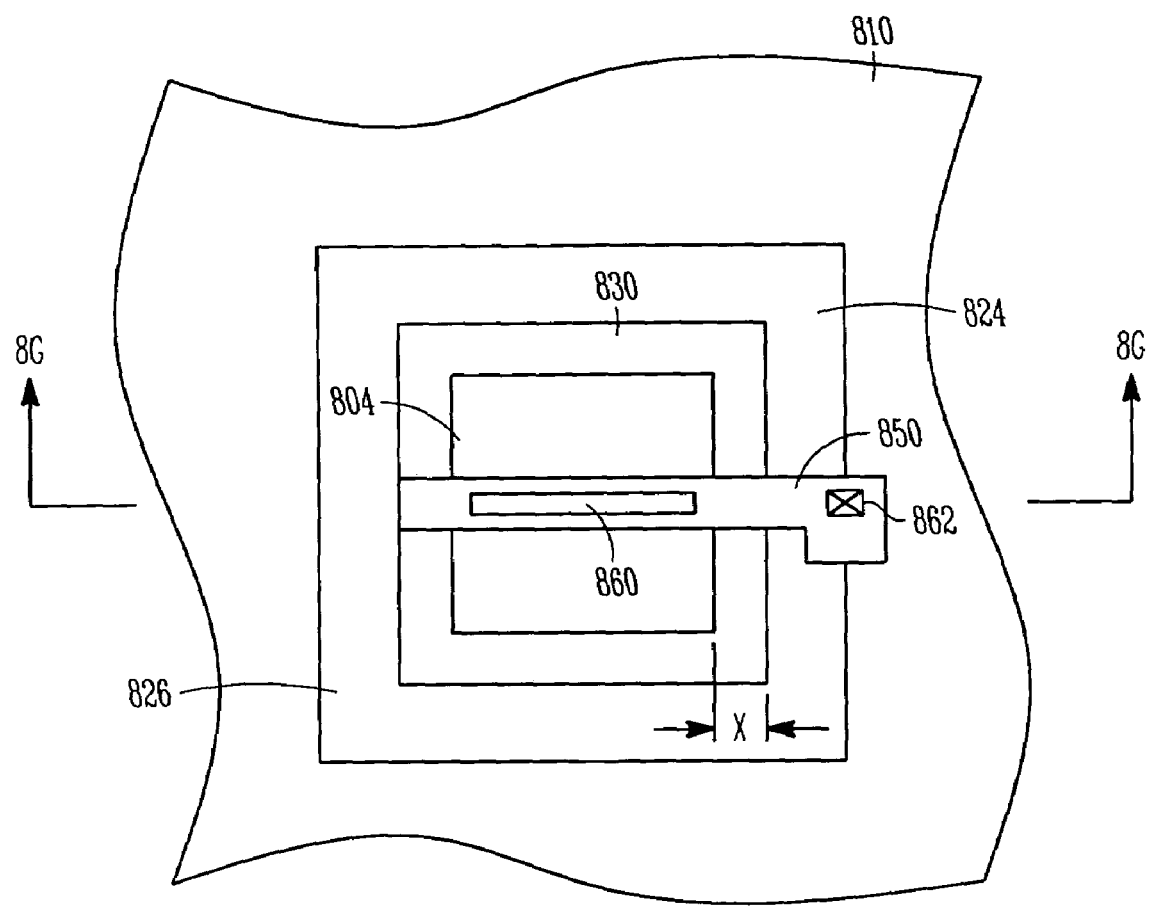
FIG. 10 is a plan view of the in-process MOSFET transistor of FIG. 8G.

A plan view of FIG. 8B is provided in FIG. 9 and better illustrates the lateral overlap of gate 830 from lower gate portion 804. The amount of overlap (X) can be controlled to adjust the amount of bird's beak in the gate dielectric. That is, a smaller overlap will increase the bird's beak of the peripheral transistor when the inter-gate dielectric is formed. A plan view of FIG. 8G is provided in FIG. 10 and better illustrates the contact regions 860 and 862.

The above described embodiments for fabricating FET transistors in a semiconductor also containing non-volatile floating gate transistors allow additional control of transistor gate dielectric smiling, or bird's beaks. An additional re-oxidation process is performed by opening an upper poly-silicon layer prior to forming an inter-poly oxide dielectric.

The invention claimed is:

1. A method of adjusting a break down voltage of a field effect transistor (FET) comprising:
   forming source and drain regions in a semiconductor substrate active area, wherein the source and drain are laterally separated by a channel region;
   fabricating a transistor gate vertically over the channel region and separated therefrom by a gate oxide, wherein the transistor gate has at least one lateral edge that selectively extends outwardly from and circumferentially about a lateral edge of the active area:
   forming an oxide over the transistor gate, the oxide contributes to a re-oxidation of a portion of the gate oxide to adjust the break down of the FET; and
   forming a structure above and in electrical contact with the transistor gate.

2. The method of claim 1 further comprises removing a portion of the oxide over the transistor gate to expose a surface of the transistor gate.

3. The method of claim 1 wherein the lateral edge of the transistor gate is laterally spaced from the edge of the active area at the gate oxide by a distance X, where distance X is selected to adjust a magnitude of the re-oxidation.

4. A method of fabricating a field effect transistor (FET) comprising:
   forming a gate dielectric layer comprising an oxide in contact with a substrate active area;
   etching the active area to form an active area lateral edge;
   forming a first poly-silicon layer in contact with the gate dielectric layer, such that the first poly-silicon layer is separated from the etched active area by the gate dielectric layer;
   etching the first poly-silicon layer to provide at least one opening therethrough, the at least one opening being laterally spaced apart from an edge of the active area;
   forming a dielectric layer comprising oxide in contact with the etched first poly-silicon layer such that the dielectric layer is formed in the at least one opening and contributes to a re-oxidation of a portion of the gate dielectric; and
   providing electrical contact to the etched first poly-silicon layer.

5. The method of claim 4 wherein the at least one opening is spaced from the edge of the active area by a distance selected to control an amount of re-oxidation.

6. The method of claim 4 wherein the dielectric layer comprises layers of oxide-nitride-oxide (ONO).

7. The method of claim 4 further comprises forming a second poly-silicon layer adjacent to the dielectric layer such that the dielectric layer separates the second poly-silicon layer from the etched first poly-silicon layer.

8. The method of claim 7 further comprises etching an opening through the dielectric layer prior to forming the second poly-silicon layer such that the second poly-silicon layer contacts the etched first poly-silicon layer.

9. The method of claim 4 wherein providing electrical contact to the etched first poly-silicon layer comprises forming an electrical contact structure to the etched first poly-silicon layer.

10. A method of fabricating a field effect transistor (FET) comprising:
    forming a gate dielectric layer comprising an oxide in contact with a substrate active area;
    forming a first poly-silicon gate section in contact with the gate dielectric layer, such that the first poly-silicon gate section is separated from the active area by the gate dielectric layer;
    forming a first poly-silicon layer in contact with first poly-silicon gate section;
    etching the first poly-silicon layer to provide at least one opening therethrough, the at least one opening being spaced from an edge of the first poly-silicon gate section;
    forming a dielectric layer comprising oxide in contact with the etched first poly-silicon layer such that the dielectric layer is formed in the at least one opening and contributes to a re-oxidation of a portion of the gate dielectric; and
    providing electrical contact to the first gate section.

11. The method of claim 10 wherein the at least one opening is spaced from the edge of the first gate section by a distance selected to control an amount of re-oxidation.

12. The method of claim 10 wherein the dielectric layer comprises layers of oxide-nitride-oxide (ONO).

13. The method of claim 10 further comprises forming a second poly-silicon layer adjacent to the dielectric layer such that the dielectric layer separates the second poly-silicon layer from the etched first poly-silicon layer.

14. The method of claim 13 further comprises etching an opening through the dielectric layer prior to forming the second poly-silicon layer such that the second poly-silicon layer contacts the etched first poly-silicon layer.

15. The method of claim 10 wherein providing electrical contact to the first gate section comprises forming an electrical contact structure to the etched first poly-silicon layer.

16. A method of fabricating a field effect transistor (FET) in a non-volatile memory device, the method comprising:
    implanting source and drain regions in a semiconductor substrate active area, wherein the source and drain are laterally separated by a channel region;
    fabricating a poly-silicon transistor gate vertically over the channel region and separated therefrom by a gate oxide, wherein the transistor gate has at least one lateral edge that selectively extends outwardly from and circumferentially about a lateral edge of the active area;
    forming a floating gate inter-gate dielectric layer comprising an oxide over the poly-silicon transistor gate, the dielectric layer contributes to a re-oxidation of a portion of the gate oxide; and
    forming a poly-silicon gate structure above and in electrical contact with the transistor gate, wherein the poly-silicon gate structure is formed from poly-silicon layer used to form control gates of floating gate memory cells in the non-volatile memory device.

17. The method of claim 16 wherein the floating gate inter-gate dielectric layer comprises layers of oxide-nitride-oxide (ONO).

18. A method of fabricating a field effect transistor (FET) and floating gate transistor in a semiconductor memory device, the method comprising:
    forming first and second active substrate areas, wherein the first and second active areas are each separated by shallow trench isolation (STI) regions positioned on the first and second active substrate areas;

forming a gate dielectric layer comprising an oxide material in contact with the first and second active areas;

forming at least one poly-silicon layer over the gate dielectric layer;

etching the at least one poly-silicon layer to form floating gates vertically above both the first and second active areas;

forming a dielectric layer comprising oxide in contact with the floating gates, wherein the dielectric layer contributes to a re-oxidation of a portion of the gate dielectric under the floating gates;

forming a second poly-silicon layer over the dielectric layer;

etching the second poly-silicon layer to form control gates vertically over the floating gates;

for the FET, providing electrical contact to one of the floating gates; and for the floating gate transistor, providing electrical contact to one of the control gates.

19. The method of claim 18 wherein the dielectric layer comprises layers of oxide-nitride-oxide (ONO).

20. The method of claim 18 wherein the first and second active substrate areas are formed by etching a substrate, and the gate dielectric and at least one poly-silicon layer are formed prior to etching the substrate.

21. The method of claim 18 wherein the re-oxidation of the portion of the gate dielectric under the floating gates is located near an edge of the first and second active areas.

22. A method of fabricating a field effect transistor (FET) and floating gate transistor in a semiconductor memory device, the method comprising:

forming first and second active substrate areas, wherein the first and second active areas are each separated by shallow trench isolation (STI) regions positioned on the first and second active substrate areas;

forming a gate dielectric layer comprising an oxide material on the first and second active areas;

forming a first poly-silicon layer over the gate dielectric layer;

etching the first poly-silicon layer to form first gate sections vertically above both the first and second active areas;

forming a second poly-silicon layer over the first gate sections;

etching the second poly-silicon layer to form second gate sections in contact with each of the first gate sections, wherein the first and second gate sections form floating gates;

forming a dielectric layer comprising oxide in contact with the second gate sections, wherein the dielectric layer contributes to a re-oxidation of a portion of the gate dielectric under the floating gates;

forming a third poly-silicon layer over the dielectric layer;

etching the third poly-silicon layer to form control gates vertically over the floating gates;

for the FET, providing electrical contact to one of the floating gates; and for the floating gate transistor, providing electrical contact to one of the control gates.

23. The method of claim 22 wherein the dielectric layer comprises layers of oxide-nitride-oxide (ONO).

24. A method of fabricating a field effect transistor (FET) in a periphery area and floating gate transistor in an array area of a semiconductor memory device, the method comprising:

forming a transistor gate oxide layer in the periphery and array areas;

forming shallow trench isolation (STI) regions in the periphery and array areas;

depositing a floating gate poly-silicon layer in the periphery and array areas above the gate oxide;

etching openings in the floating gate poly-silicon layer in both the periphery and array areas;

forming a dielectric layer comprising an oxide over the etched floating gate poly-silicon layer and in the openings in the periphery and array areas, wherein the dielectric layer contributes to a re-oxidation of a portion of the gate dielectric under the floating gate poly-silicon;

depositing a control gate poly-silicon layer in the periphery and array areas above the dielectric layer;

making electrical contact to the control gate poly-silicon layer in the array area; and making electrical contact to the floating gate poly-silicon in the periphery area.

25. The method of claim 24, wherein forming shallow trench isolation regions in the periphery and array areas comprise forming the shallow trench isolation regions prior to etching openings in the floating gate poly-silicon layer.

26. The method of claim 25 wherein the shallow trench isolation regions are formed using a self-aligned process.

* * * * *